(12) United States Patent
Pani et al.

(10) Patent No.: US 7,382,156 B2
(45) Date of Patent: Jun. 3, 2008

(54) METHOD AND APPARATUS FOR UNIVERSAL PROGRAM CONTROLLED BUS ARCHITECTURE

(75) Inventors: Peter M. Pani, Mountain View, CA (US); Benjamin S. Ting, Saratoga, CA (US)

(73) Assignee: Actel Corporation, Mountain View, CA (US)

( * ) Notice: Subject to any disclaimer, the term of this patent is extended or adjusted under 35 U.S.C. 154(b) by 57 days.

(21) Appl. No.: 11/219,597

(22) Filed: Sep. 1, 2005

(65) Prior Publication Data

US 2006/0202716 A1    Sep. 14, 2006

Related U.S. Application Data

(63) Continuation of application No. 10/811,422, filed on Mar. 25, 2004, now Pat. No. 6,975,138, which is a continuation of application No. 10/412,975, filed on Apr. 11, 2003, now Pat. No. 6,781,410, which is a continuation of application No. 10/231,320, filed on Aug. 28, 2002, now Pat. No. 6,624,658, which is a continuation of application No. 09/960,916, filed on Sep. 24, 2001, now Pat. No. 6,504,399, which is a continuation of application No. 09/243,998, filed on Feb. 4, 1999, now Pat. No. 6,329,839, which is a continuation of application No. 08/708,403, filed on Sep. 4, 1996, now Pat. No. 6,034,547.

(51) Int. Cl.
*H03K 19/177* (2006.01)

(52) U.S. Cl. .............................. 326/41; 326/38; 326/39

(58) Field of Classification Search .................. 326/39, 326/41
See application file for complete search history.

(56) References Cited

U.S. PATENT DOCUMENTS

| 3,473,160 | A | 10/1969 | Wahlstrom |
| 4,020,469 | A | 4/1977 | Manning |
| 4,207,556 | A | 6/1980 | Sugiyama et al. |
| 4,642,487 | A | 2/1987 | Carter |
| 4,661,901 | A | 4/1987 | Veneski |
| 4,684,830 | A | 8/1987 | Tsui et al. |

(Continued)

FOREIGN PATENT DOCUMENTS

EP       0415542 A1    3/1991

(Continued)

OTHER PUBLICATIONS

European Search Report, Application No. EP04021656, date of search Feb. 16, 2006, 4 pages.

(Continued)

*Primary Examiner*—Vibol Tan
(74) *Attorney, Agent, or Firm*—Blakely, Sokoloff, Taylor & Zafman LLP

(57) ABSTRACT

An integrated circuit including a programmable logic array with a plurality of logic cells and programmable interconnections to receive input signals and to perform logical functions to transmit output signals. The integrated circuit may also include megacells comprising a plurality of functional blocks receiving inputs and transmitting outputs. The integrated circuit may also include a programmable interconnections subsystem to cascade the megacells. The megacells are coupled to the programmable logic array.

29 Claims, 14 Drawing Sheets

U.S. PATENT DOCUMENTS

| | | | |
|---|---|---|---|
| 4,700,187 A | 10/1987 | Furtek | |
| 4,706,216 A | 11/1987 | Carter | |
| 4,720,780 A | 1/1988 | Dolecek | |
| 4,736,333 A | 4/1988 | Mead et al. | |
| 4,758,985 A | 7/1988 | Carter | |
| 4,763,020 A | 8/1988 | Takata et al. | |
| 4,786,904 A | 11/1988 | Graham, III | |
| 4,847,612 A | 7/1989 | Kaplinsky | |
| 4,855,619 A | 8/1989 | Hsieh et al. | |
| 4,870,302 A | 9/1989 | Freeman | |
| 4,918,440 A | 4/1990 | Furtek | |
| 4,935,734 A | 6/1990 | Austin | |
| 4,963,770 A | 10/1990 | Keida | |
| 4,967,107 A | 10/1990 | Kaplinsky | |
| 4,992,680 A | 2/1991 | Benedetti et al. | |
| 5,012,135 A | 4/1991 | Kaplinsky | |
| 5,135,609 A * | 8/1992 | Pease et al. | 216/41 |
| 5,140,193 A | 8/1992 | Freeman, deceased et al. | |
| 5,144,166 A | 9/1992 | Camarota et al. | |
| 5,185,706 A | 2/1993 | Agrawal et al. | |
| 5,204,556 A * | 4/1993 | Shankar | 326/41 |
| 5,208,491 A | 5/1993 | Ebeling et al. | |
| 5,212,652 A | 5/1993 | Agrawal et al. | |
| 5,220,213 A | 6/1993 | Chan et al. | |
| 5,221,865 A | 6/1993 | Phillips et al. | |
| 5,224,056 A | 6/1993 | Chene et al. | |
| 5,231,588 A | 7/1993 | Agrawal et al. | |
| 5,243,238 A | 9/1993 | Kean | |
| 5,256,918 A | 10/1993 | Suzuki | |
| 5,260,610 A | 11/1993 | Pedersen et al. | |
| 5,260,611 A | 11/1993 | Cliff et al. | |
| 5,291,079 A | 3/1994 | Goetting | |
| 5,296,759 A | 3/1994 | Sutherland et al. | |
| 5,298,805 A | 3/1994 | Garverick et al. | |
| 5,327,023 A | 7/1994 | Kawana et al. | |
| 5,329,470 A | 7/1994 | Sample et al. | |
| 5,331,226 A | 7/1994 | Goetting | |
| 5,331,571 A | 7/1994 | Aronoff et al. | |
| 5,336,950 A | 8/1994 | Popli et al. | |
| 5,341,040 A | 8/1994 | Garverick et al. | |
| 5,343,406 A | 8/1994 | Freeman et al. | |
| 5,349,691 A | 9/1994 | Harrison et al. | |
| 5,369,314 A | 11/1994 | Patel et al. | |
| 5,371,422 A | 12/1994 | Patel et al. | |
| 5,376,844 A | 12/1994 | Pedersen et al. | |
| 5,396,126 A | 3/1995 | Britton et al. | |
| 5,406,525 A | 4/1995 | Nicholes | |
| 5,422,833 A | 6/1995 | Kelem et al. | |
| 5,436,575 A | 7/1995 | Pedersen et al. | |
| 5,444,394 A | 8/1995 | Watson et al. | |
| 5,455,525 A | 10/1995 | Ho et al. | |
| 5,457,410 A | 10/1995 | Ting | |
| 5,469,003 A | 11/1995 | Kean | |
| 5,477,067 A | 12/1995 | Isomura et al. | |
| 5,483,178 A | 1/1996 | Costello et al. | |
| 5,504,440 A | 4/1996 | Sasaki | |
| 5,506,517 A | 4/1996 | Tsui et al. | |
| 5,519,629 A | 5/1996 | Snider | |
| 5,524,243 A | 6/1996 | Gheorghiu | |
| 5,550,782 A * | 8/1996 | Cliff et al. | 365/230.03 |
| 5,552,722 A | 9/1996 | Kean | |
| 5,570,040 A * | 10/1996 | Lytle et al. | 326/41 |
| 5,572,148 A | 11/1996 | Lytle et al. | |
| 5,581,199 A | 12/1996 | Pierce et al. | |
| 5,581,767 A | 12/1996 | Katsuki et al. | |
| 5,612,631 A | 3/1997 | Agrawal et al. | |
| 5,668,771 A | 9/1997 | Cliff et al. | |
| 5,689,462 A * | 11/1997 | Proebsting | 365/189.05 |
| 5,773,994 A | 6/1998 | Jones | |
| 5,815,004 A | 9/1998 | Trimberger et al. | |
| 5,825,202 A | 10/1998 | Tavana et al. | |
| 5,835,405 A | 11/1998 | Tsui et al. | |
| 5,848,005 A | 12/1998 | Cliff et al. | |
| 5,894,228 A | 4/1999 | Reddy et al. | |
| 5,894,565 A | 4/1999 | Furtek et al. | |
| 5,903,165 A | 5/1999 | Jones et al. | |
| 5,905,655 A | 5/1999 | Deeley | |
| 5,969,543 A | 10/1999 | Erickson et al. | |
| 6,034,547 A | 3/2000 | Pani et al. | |
| 6,064,599 A | 5/2000 | Cliff et al. | |
| 6,167,559 A | 12/2000 | Furtek et al. | |
| 6,246,259 B1 | 6/2001 | Zaliznyak et al. | |
| 6,496,887 B1 | 12/2002 | Plants | |

FOREIGN PATENT DOCUMENTS

| | | |
|---|---|---|
| EP | 0415542 A2 | 9/1991 |
| EP | 0 630 115 A2 | 12/1994 |
| EP | 0630115 A2 | 12/1994 |
| GB | 2180382 A | 3/1987 |
| GB | 2295738 A | 6/1996 |
| WO | WO92/08286 | 5/1992 |
| WO | WO94/10754 | 5/1994 |
| WO | WO94/28475 | 12/1994 |
| WO | WO95/04402 | 2/1995 |
| WO | WO95/04404 | 2/1995 |
| WO | WO 95/28769 | 10/1995 |
| WO | WO96/05964 | 2/1996 |
| WO | WO96/35261 | 11/1996 |

OTHER PUBLICATIONS

Communication pursuant to Article 96(2) EPC, Application No. 97 939 805.4-2215, Ref. E2246.99, Jul. 29, 2005, Advantage Logic, Inc., 4 pages.

Richard Cliff et al., "A Dual Granularity and Globally Interconnected Architecture for a Programmable Logic device", Proceedings of the IEEE 1993 custom Integrated Circuits Conference, May 1993, pp. 7.3.1-7.3.5.

Altera Corporation, Data Sheet, "Flex EPF81188 12,000-Gate Programmable Logical device", Sep. 1992, Version 1.

Minnick, R.C., "A Survey of Microcellular Research", Journal of the Association for Computing Machinery, vol. 14, No. 2, Apr. 1967, pp. 203-241.

Shoup, R.G., "Programmable Cellular Logic Arrays", Ph.D dissertation, Carnegie-Mellon University, Pittsburgh, PA, Mar. 1970—Partial.

Spandorfer, L.M., "Synthesis of Logic Functions on an Array of Integrated Circuits", UNIVAC, Division of Sperry Rand Corporation, Blue Bell, PA, Contract AF 19 (628) 2907, AFCRL 66-298, Project No. 464504, Nov. 30, 1965.

Ping-Tsung Wang et al., "A High Performance FPGA with Hierarchical Interconnection Structure", Institute of Electrical and Electronic Engineers, pp. 239-242, May 30, 1994.

Motorola Product Brief, "MPA10XX Field Programmable Gate Arrays", 4 pages total, Sep. 27, 1993.

Krambeck, R.H. "ORCA: A High Performance, Easy to Use SRAM Based Architecture", Wescon '93 record, pp. 310-320, Sep. 20-30, 1993.

Buffoli et al., "Dynamically Reconfigurable Devices used to Implement a Self-Tuning, High Performance PID Controller", IEEE 1989, pp. 107-112.

Devadas, S., "Boolean Decomposition of Programmable Logic Arrays", IEEE 1988, pp. 2.5.1-2.5.5.

Vidal, J., "Implementing Neural Nets with Programmable Logic", IEEE 1988, pp. 50-53.

Yachyang Sun et al., "An Area Minimizer for Floorplans with L-Shaped Regions", 1992, Int'l. Conference on computer Design, pp. 383-386.

Atmel Corporation, "Field Programmable Gate Arrays—AT6000 Series", 1993.

Sinan Kaptanoglu et al., "A New High Density and Very Low Cost Reprogrammable FPGA Architecture", 10 pages, no date.

Dave Bursky, "Fine-Grain FPGA Architecture Uses Four Levels of Configuration Hierarchy", Electronic Design, pp. 33-34, Oct. 1, 1993.

Dick L. Liu et al., "Design of Large Embedded CMOS PLA's for Built-In Self-Test", IEEE 1988, pp. 50-53.

Xilinx, "The Programmable Gate Array Data Book", 1992.

F. Zlotnick et al., A High Performance Fine-Grained Approach to SRAM based FPGAs, Wescon '93 Record, pp. 321-326, Sep. 28-30, 1993.

Barry K. Britton et al., "Optimized Reconfigurable Cell Array Architecture for High Performance Field Programmable Gate Arrays", Proccedings of the IEEE 1993 Custom Integrated Circuits Conference, May 1993, pp. 7.2.1-7.2.5.

Aggarwal, Aditya Kumar, "Routing Algorithms and Architectures for Hierarchial Field Programmable Gate Arrays," Jan. 1994 (99 pages).

Chow, Paul et al., "A 1.2 μm CMOS FPGA Using Cascaded Logic Blocks and Segmented Routing," Department of Electrical Engineering, University of Toronto, Toronto, Ontario, Canada, (12 pages).

Grunbacher, Herbert et al., "Field-Programmable Gate Arrays: Architectures and Tools for Rapid Prototyping," Springer-Verlag, from Second International Workshop on Field-Programmable logic and Applications, Vienna, Austria, Aug. 31-Sep. 2, 1992 (10 pages).

Ikawa et al., "A One Day Chip: An Innovative IC Construction Approach Using Electrically Reconfigurable Logic VLSI with On-Chip Programmable Interconnections", IEEE Journal of Solid State Physics, vol. SC-21, No. 2, Apr. 1986, (pp. 223-227).

Wahlstrom, Sven, "Programmable Logic Arrays-Cheaper by the Millions", Electronics, Dec. 11, 1967, pp. 90-95.

XILINX "XC4000 Data Book, Logic Cell Array Family," Dec. 1991 (65 pages).

XILINX "XC6200 Field Programmable Gate Arrays," Apr. 24, 1997, Version 1.10 (73 pages).

AIPLA's Model patent Jury Instructions, 2005, American Intellectual Property Law Associations, Version 1.1, Feb. 2006, 46 pages.

Richard G. Shoup, "Programmable Cellular Logic Arrays", Carnegie-Mellon University, 1970.

* cited by examiner

○ : Each can be bi-directional, tri-statable

METHOD AND APPARATUS FOR UNIVERSAL PROGRAM CONTROLLED BUS ARCHITECTURE

REFERENCE TO RELATED APPLICATIONS

This application is a continuation of U.S. Application No. 10/811,422 filed Mar. 25, 2004 now U.S. Pat. No. 6,975,138; which is a continuation of U.S. application Ser. No. 10/412,975 filed Apr. 11, 2003, U.S. Pat. No. 6,781,410, which is a continuation of U.S. application Ser. No. 10/231,320 filed Aug. 28, 2002, U.S. Pat. No. 6,624,658, which is a continuation of U.S. application Ser. No. 09/960,916 filed Sep. 24, 2001, U.S. Pat. No. 6,504,399, which is a continuation of U.S. application Ser. No. 09/243,998 filed Feb. 4, 1999, U.S. Pat. No. 6,329,839, which is a continuation of U.S. application Ser. No. 08/708,403 filed Sep. 4, 1996, U.S. Pat. No. 6,034,547.

BACKGROUND OF THE INVENTION

1. Field of the Invention

The present invention is directed to a programmable, configurable bus system of lines to interconnect electrical components for an electrical/electronics system.

2. Art Background

Megacells are described as block components such as static random access memory (SRAM), microcontrollers, microprocessors and buffers. Sometimes it is desirable to interconnect a plurality of megacells together to provide a larger functional entity. One way to interconnect multiple megacells and logic circuits is through a hardwired bus system. Examples are illustrated in FIGS. 1a, 1b and 1c. FIG. 1a illustrates a bus interface to a dual port SRAM megacell. Bus lines include DATA 0-DATA15, READA0-READA9, WRITEA0-WRITEA9. To couple multiple megacells, the data lines are shared among the coupled cells. However, separate read and write lines would be required for each megacell. To the contrary, if the megacells were coupled to generate a deeper combined megacell, the data lines would be separate for each megacell and the read and write lines would be shared among the megacells. Control signals are then be used to select a particular megacell for a particular operation. This is illustrated in FIGS. 1b and 1c.

Such configurations are hardwired and cannot easily be changed to accommodate different configurations. Furthermore, if errors occur in the mask generated, repairs are not easily made, as configurability is minimal. In addition to providing a bus system to interconnect multiple megacells, tristatable input ports are sometimes used to enable multiple inputs to be input to a particular bus line thus allowing a system level communication between logic to megacells or megacells to megacells. However, a single tristate can directly couple to only one line.

BRIEF DESCRIPTION OF THE DRAWINGS

The objects, features and advantages of the present invention will be apparent to one skilled in the art from the following detailed description in which.

DETAILED DESCRIPTION

The system of the present invention provides a flexible programmable bus structure system of lines to couple one or more circuits for input and output as well as to each other. In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

Figure 1A:
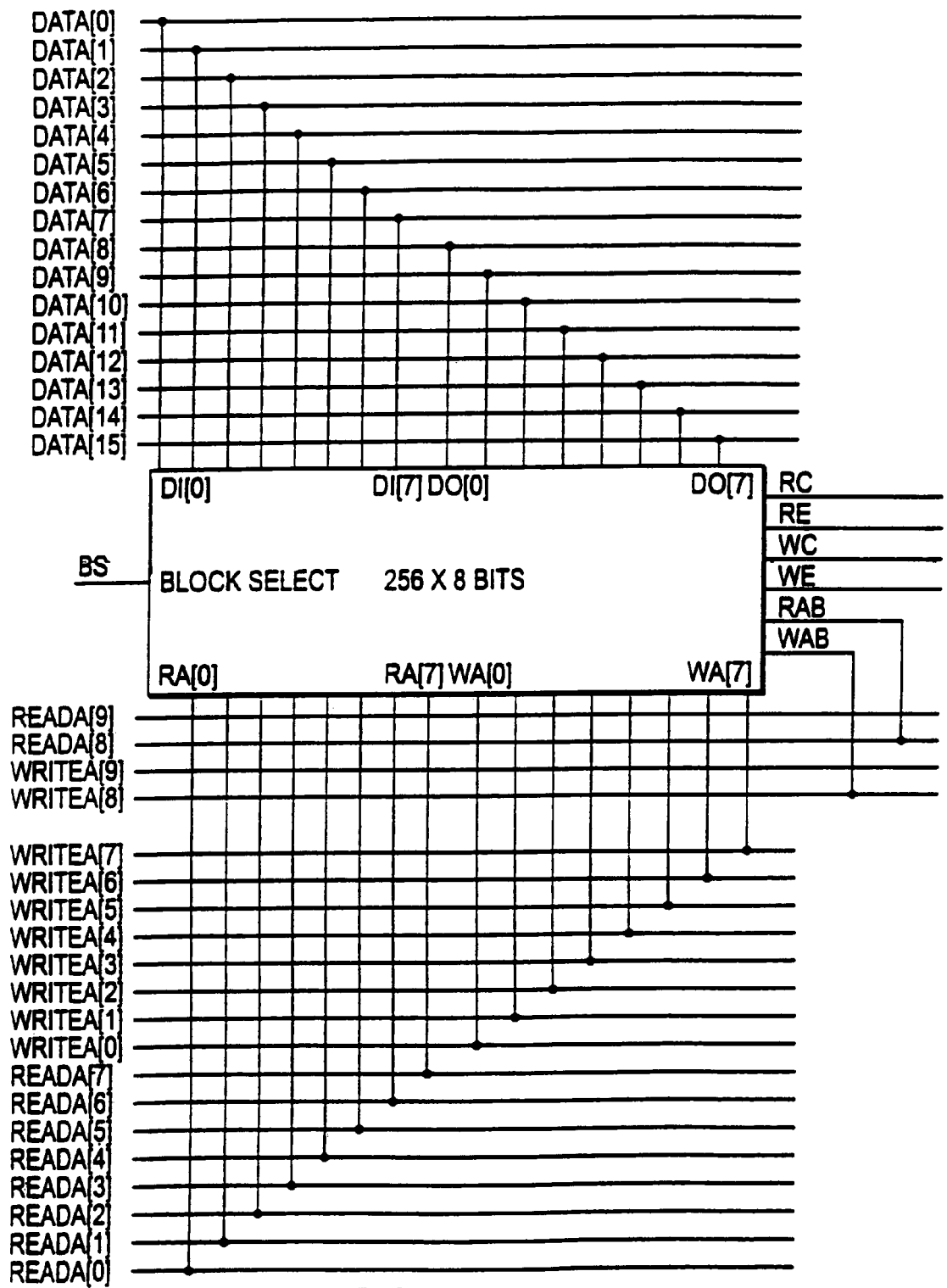
FIGS. 1a, 1b and 1c illustrate interconnections of prior art megacells.
Figure 1B:
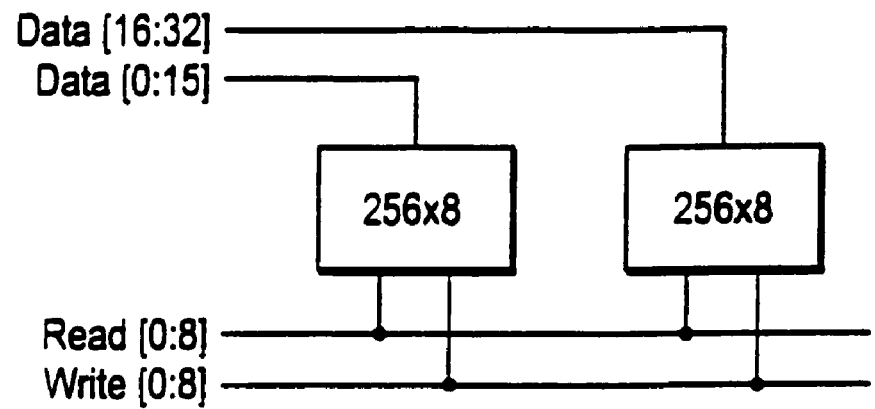
Figure 1C:
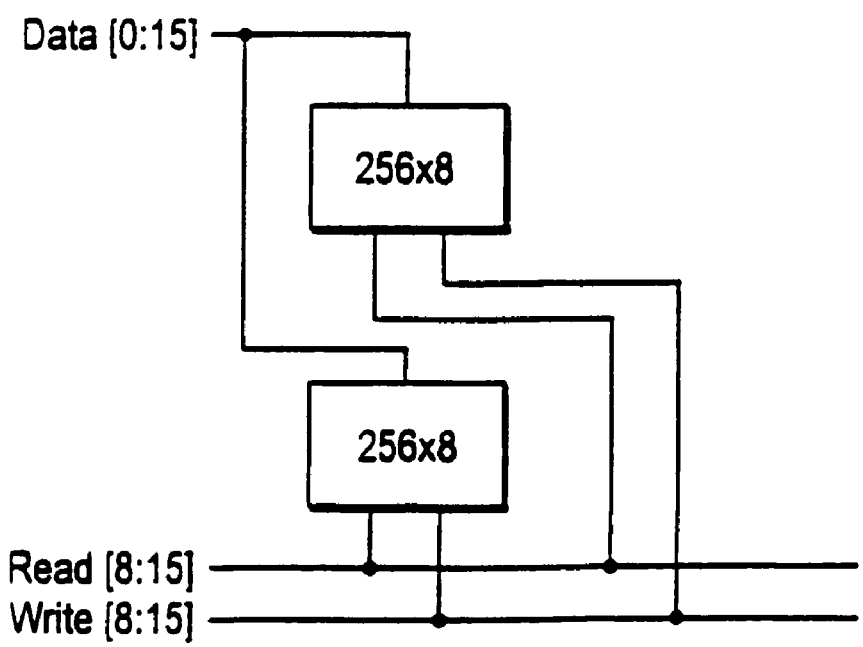
Figure 2A:
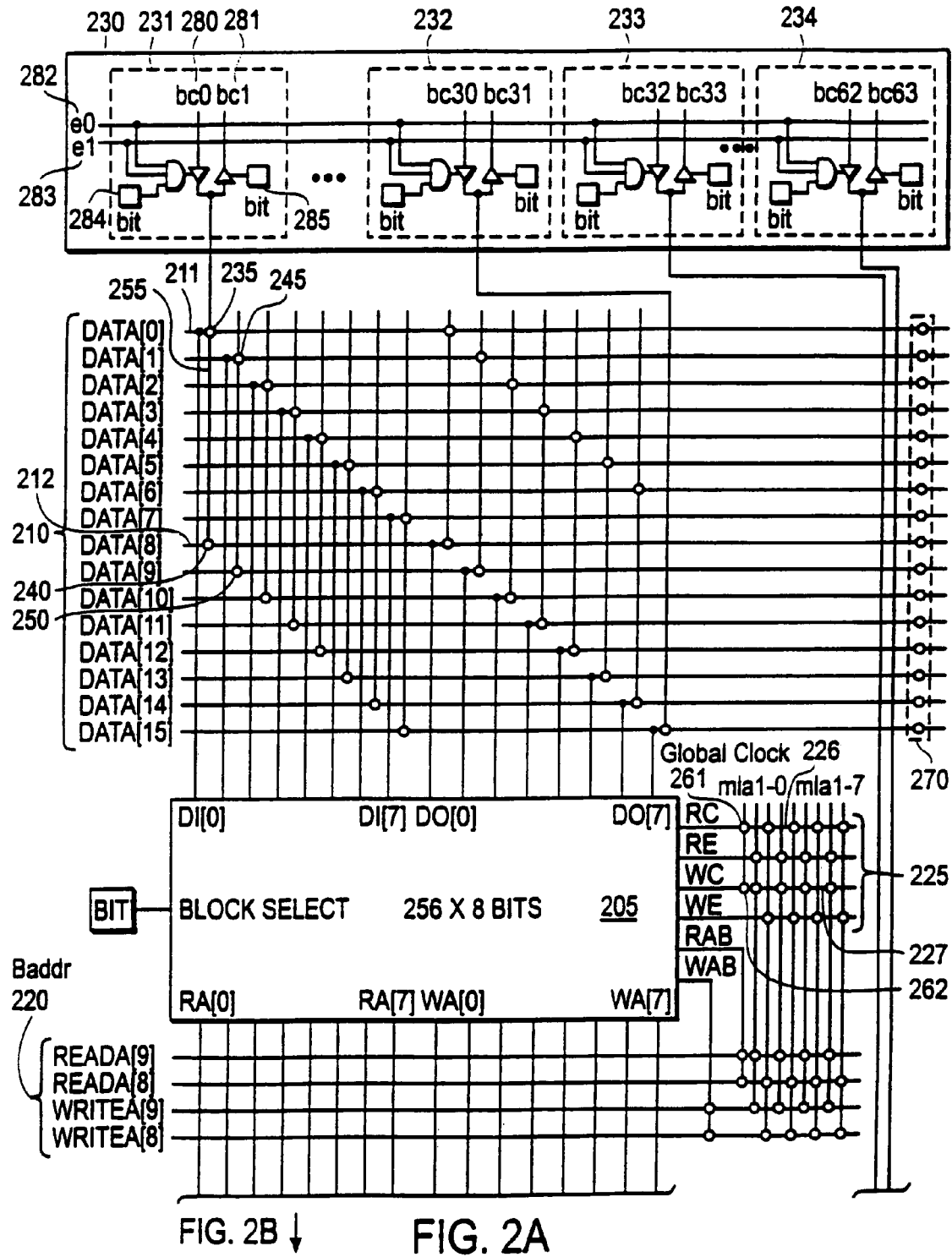
FIGS. 2A and 2B illustrate one embodiment in which logic is programmably coupled to the megacell.
Figure 2B:
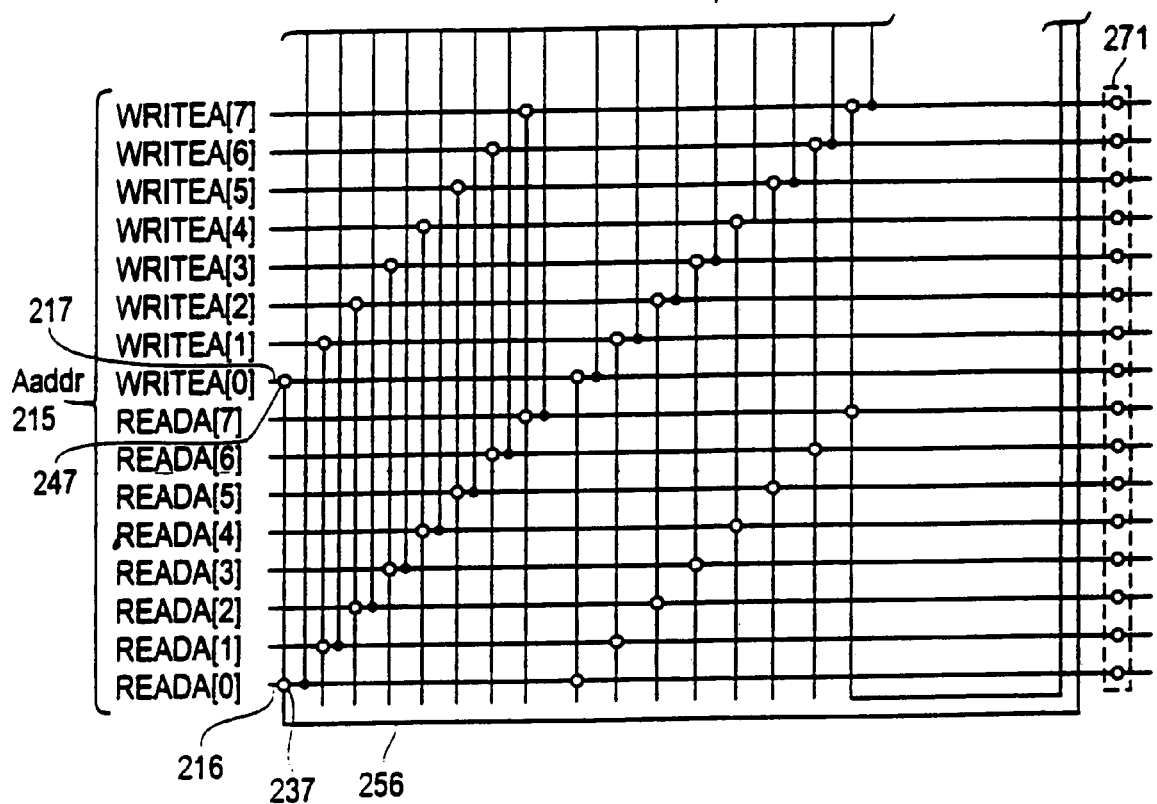

One embodiment of the programmable bus system is illustrated in FIGS. 2A and 2B. The system is illustrated using a megacell circuit; however, it is readily apparent that the system can be utilized with a variety of types of circuits and/or components. The type of megacell component used in the following discussion is a 256×8 dual port static random access memory (SRAM). However, the bus system described herein is not limited to SRAM components. A variety of components, such as microcontrollers, buffers, digital signal processors (DSPs) can be coupled to the bus system described herein.

FIGS. 2A and 2B illustrate one embodiment of the configurable bus system of the present invention. Referring to FIGS. 2A and 2B, the configurable bus system of lines includes groups of lines 210, lines 215, and lines 220, 225. Each data input/output port of the megacell 205 is connected to one line of lines 210. For example, DI[0] is connected to Data[0], DI[1] is connected to Data[1], etc. In addition, each read or write address port of the megacell 205 is connected to one of the group of lines 215. Furthermore, lines 225 are connected to the control ports of the megacell 205. It is recognized that the exemplary system described herein has been programmed to convey address, data and control information across certain of the lines which form the bus system of lines. It is readily apparent that in other applications the system may only convey other combinations of information such as data and control. In addition, one skilled in the art recognizes that the lines are programmable and can be configured for a variety of types of information in addition to the types of information described herein.

In the present embodiment, data is preferably input to the megacell 205 and output from the megacell through interface logic 230. As will be described below, the interface logic is embodied in a programmable logic device, such as a field programmable gate array (FPGA); however, other types of logic can be used. A first set of programmable connections programmably couple the interface logic 230 to the data input/output ports of the megacell 205 (e.g., elements 235, 240, 245, 250). For example, programmable elements 235, 240 selectively connect a first line 255 from the interface logic 230 to lines Data[0] 211 and Data[8] 212. In addition, in the present embodiment, the programmable elements of the first set of programmable elements programmably couple the interface logic 230 to line 215. For example, programmable elements 237, 247 selectively connect a first line 256 from the input/output logic 230 to bussed lines READA[0] 216 and WRITEA[0] 217. Furthermore, the location of the programmable elements and the lines that each programmable element selectively connect to can be varied according to application. FIGS. 2A and 2B illustrate one arrangement of programmable elements of the first set of programmable elements that provides flexibility in configuring the bus system of lines.

The control signals to the megacell 205 can be similarly transmitted over the configurable bus system described herein. A second set of programmable connections are used to selectively connect control signals received from the interface logic 230 to the lines 225 and megacell 205. For example, programmable elements 261, 262 selectively connect a global clock input to lines 226, 227. In addition, in the present embodiment, lines READA[8], READA[9], WRITEA[8], WRITEA[9] (220 collectively) are used to provide the higher order address bits as control inputs to select other coupled megacells. This illustrates the capability of this innovative bus system to provide system level integration.

Preferably, a third set of programmable connections are used to selectively extend the number of megacells coupled to the configurable bus system. The bus system is configurable using elements of the third set of programmable connections to selectively connect on or more megacells to the bus system of lines. The third set of programmable connections selectively limit the load on the lines for better performance by extending the lines (and therefore increasing the load) only when needed. In the present embodiment, for example, programmable elements 270, 271 selectively extend the lines 210 and lines 215.

In addition, it is preferred that the interface logic 230 is programmable and provides bidirectional access to the bus. In addition, it is preferably that the interface logic provides three-statable control to the bus. In particular, control bits and associated logic is used to provide bidirectional, three state control and selective input/output of a plurality of external connections to the lines of the bus system. Referring to FIG. 2, the input/output logic 230 includes a plurality of elements, e.g., 231, 232, 233, 234. Each element is coupled to two external connections 280, 281. Each element is further coupled to enable control signals, e0 282, e1 283. The enable control signals e0, e1 and control bits 284, 285 function to provide the three state bus functionality that selects one of two external connections for input to or output from the bus. Control bit 284 controls the connection as input to the megacell 205 and control bit 285 controls the connection as output from the megacell 205. If the control bit 284 is set to a first state, e.g., zero, the three-state connection is disabled. If the control bit 284 is set to a second state, e.g., 1, the state of the connection is controlled by enable control signals e0, e1. Although the present embodiment incorporates the bidirectional, three state access to the bus system of lines, it is contemplated that bidirectional three state access mechanism is implemented separate form the interface logic.

The programming of the bus system of lines can be achieved a variety of ways. One method is to manually program the different programmable connections associated with particular lines of the bus system of lines. Other automated methods are also contemplated. Obviously, once programmed, the programmable connections can remain in the programmed state. Alternately, a dynamic programmable system can be provided wherein control circuitry coupled to the bus system and the programmable connections can determine, prior to a data transfer, those connections to program in order to configure the bus system of lines to transfer the data. This control circuitry could reside in a circuit coupled to the bus system for the transfer of data or in a circuit external to the bus system and connected circuits. For example, the bus system may couple a processor or arithmetic logic unit and memory. The processor or ALU can contain the control circuitry to configure the bus for each data transfer or plurality of transfers.

Furthermore, it is contemplated that the connections to be programmed can be determined a variety of ways in order to configure the bus system for a general transfer or specific transfers of data. For example, the control circuitry could examine the content of the data to be transferred and the control signals issued prior to or contemporaneous with a request to transfer or a signal indicating data is to be transferred (e.g., read or write signals or commands) to determine the programmable connections to be programmed.

The bus system described can be used to connect components, logic circuits and the like which span across one or more elements. In the present example, as noted above, the bus system is used to connect memory (SRAM) to the logic of a programmable logic device (PLD) such as a field programmable gate array (FPGA). More particularly, in the present embodiment, the bus system is used to integrate the memory into the same component as the FPGA. The FPGA, embodied as the interface logic in the present embodiment, preferably functions as control logic for accessing the SRAM or as interface logic between the SRAM and other devices. Preferably, a programmable logic device such as those described in U.S. Pat. No. 5,457,410 and U.S. patent application Ser. No. 08/534,500, filed Sep. 27, 1995 is used.

Figure 3:
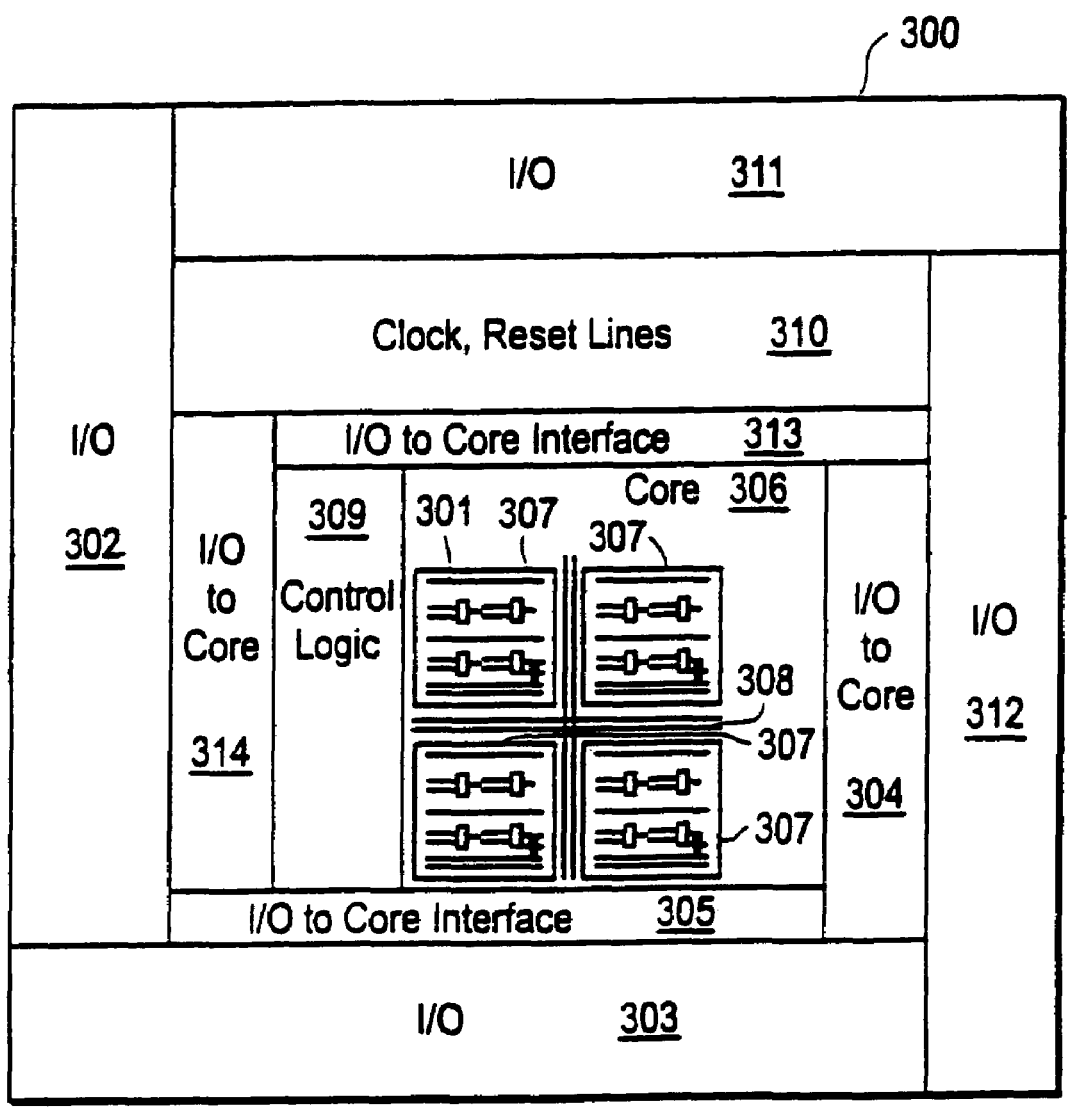
FIG. 3 is a block diagram illustration of exemplary programmable logic utilized to implement one embodiment of the configurable bus system of the present invention.

FIG. 3 is a block diagram of an exemplary FPGA 300. The I/O logic blocks 302, 303, 311, and 312 provide an interface between external package pins of the FPGA 300 and the internal user logic either directly or through the I/O to Core interface 304, 305, 313, 314. The external package pins are coupled to the lines of bus system (210, 215, FIG. 2), the signals that are processed through the input/output logic (230 FIG. 2), and the ports of the megacell (205, FIG. 2). Four interface blocks 304, 305, 313 and 314 provide decoupling between core 306 and logic 302, 303, 311 and 312.

The Core 306 includes configurable logic and an interconnect hierarchy. In the present embodiment, the logic is organized in a number of clusters 307 of logic which are intraconnected by an I-Matrix 301 and interconnected by MLA routing network 308. The core also includes control/programming logic 309 to control the bits for programming the intraconnection and interconnection lines. In the embodiment described herein, SRAM technology is utilized. However, fuse or antifuse, EEPROM/ferroelectric or similar technology may be used. In order to minimize skewing, a separate clock/reset logic 310 is used to provide clock and rest lines on a group basis.

Figure 4A:
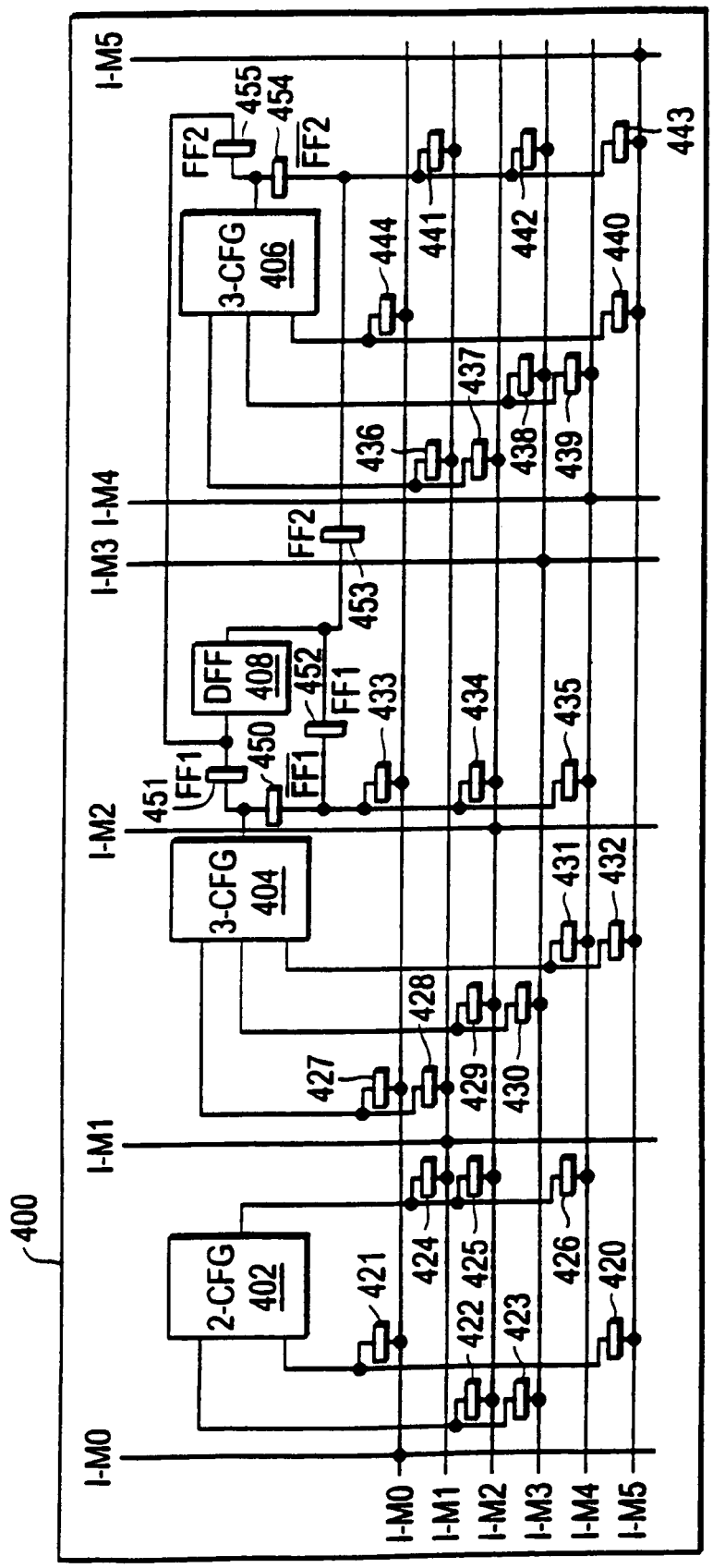
FIGS. 4A and 4B illustrate the organization of the programmable logic of FIG. 3.

The present embodiment provides logic in groups called clusters. FIG. 4a is an example of a logic cluster. It is contemplated that the logic cluster illustrated by FIG. 4a is illustrative and logic cluster can be formed of other elements such as logic gates and flip-flops. Referring to FIG. 4a, the logic cluster 400 is formed of four logic elements. These elements include one 2 input combinational logic or configurable function generator (CFG) 402, two three input CFGs 404, 406 and D flip-flop 408. CFG 402 can also be a three input CFG. The CFGs 402, 404, 406 are programmable combinatorial logic that provide a predetermined output based using two input values (for CFG 402) or three input values (for CFGs 404, 406). The CFGs are programmed with values to provide output representative of a desired logic function. The D flip flop 408 functions as a temporary storage element such as a register.

This combination of one two input, one output CFG, two three input one output CFGs and a D flip flop enable a variety of logic and arithmetic functions to be performed. For example, the elements can be programmed to perform such functions as comparator functions or accumulator functions. In the present embodiment, it is used to selectively couple bus signal lines to input/outputs of a megacell and to input/output logic. It should be noted that this combination of elements provides a fine granularity without the addition of redundant elements which add to the die size and speed of processing. Furthermore, the combination of elements also maximizes usage of elements thereby maximizing usage of die size space. The fine granularity characteristic resulting in more output points that can be tapped is a desirable characteristic as often an intermediate signal generated by a particular combination of elements is needed.

In addition, the local interconnect within the cluster is structured to enable signals to be processed within minimum delays. The cluster elements, 402, 404, 406, 408, are connected through interconnection lines I-M0 through I-M5 (referred to herein collectively as I-Matrix lines) which are oriented horizontally and vertically through the logic cluster. These intraconnections of a cluster are programmable through switches, for example switches 420-444. Intraconnections lines I-M0 to I-M5 and switches 420-444 form what is referred to herein as the I-Matrix. The I-Matrix provides connectability among the elements 402, 404, 406, 408 to at least one other element of the cluster. For example, the output of the CFG 202 can be connected to the input of CFG 404 by enabling switches 424 and 428.

To ensure minimum signal delays during processing, separate, direct connections are provided between the D flip flop 408 and the three input CFGs 404, 406. Continuing reference to FIG. 4*a*, switches 450-455 and connected lines provide such connections. It has been determined that the input and output of the three input CFGs 404, 406 often perform programmed functions in conjunction with the register 408. For example the three input CFGs can be utilized with the register to provide a one bit multiplexing function.

The bi-directional switches 450-455 can be programmed a variety of ways to route the signal to achieve a specific function. For example, a signal output by CFG 404 can drive D flip-flop 408 by enabling switch 451. Alternately, the signal may be driven onto the I-Matrix by enabling switch 450. Similarly, the output of CFG 406 can drive the input of the D flip-flop 408 by enabling switch 455. Other routing paths by selectively enabling switches are also possible. Furthermore, the output of the CFG 402 can drive the D flip-flop 408 by an indirect connection through the I-Matrix. thus, extreme flexibility is achieved.

The routing of the output signal of the D flip-flop is also programmable through switches 452 and 453. By selectively enabling switches 452 or 453 and selective switches of the I-Matrix, the output signal can be routed to any one of the elements of the cluster or of other clusters. The signal output is selectively routed through the switches 433-435 adjacent to the CFG 204 or to switches 441, 442 and 443 adjacent to CFG 406. Die savings are achieved without decreasing the level of usage of elements in the device.

Figure 4B:
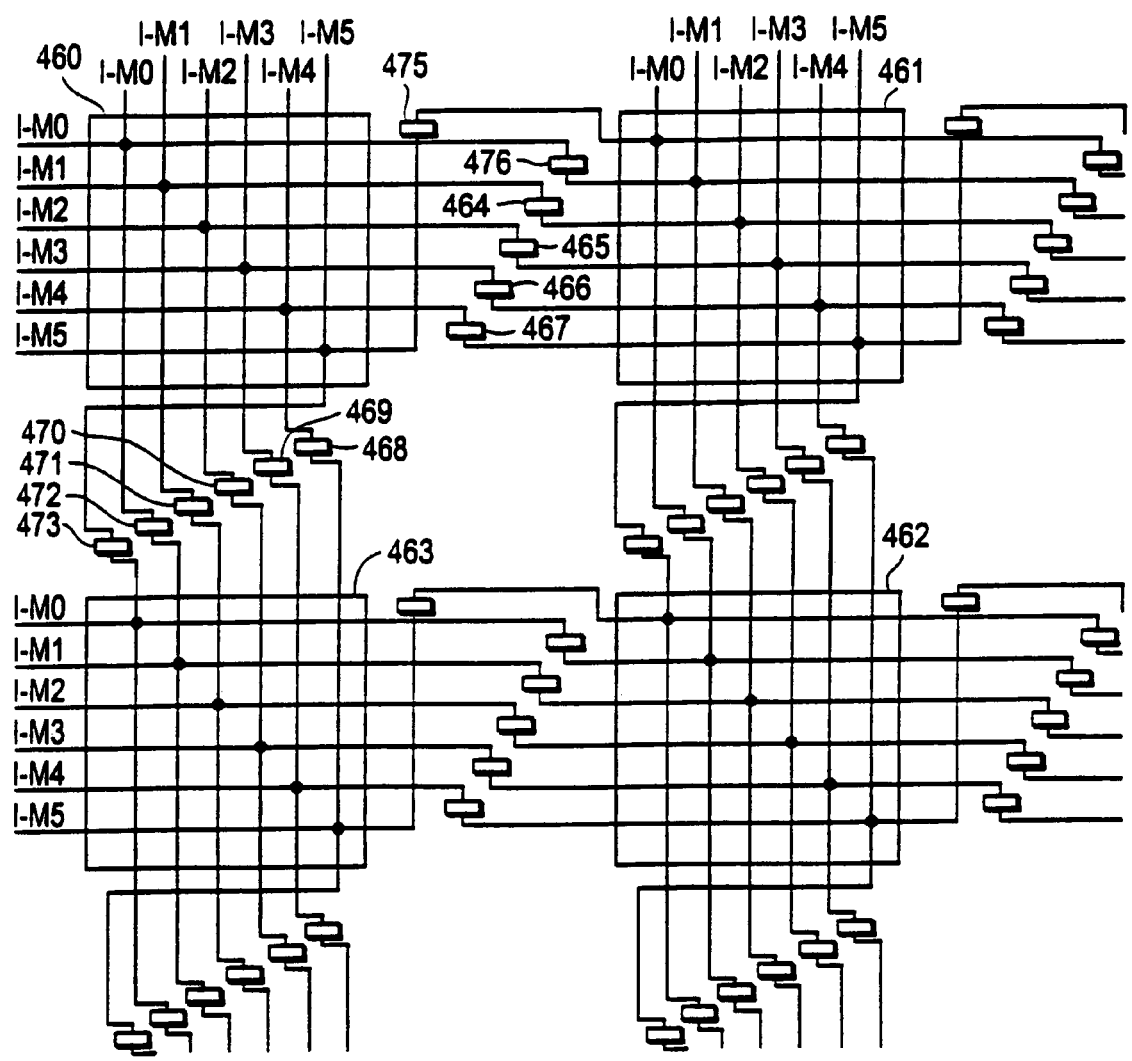

Each logic cluster is connectable to the other logic clusters inside the logic block through switches extending the I-matrix between neighboring clusters. FIG. 4*b* illustrates I-matrix interconnection lines I-M0 to I-M5 of a first logic cluster 460 selectively connected to the I-Matrix lines of adjacent logic clusters 461 and 463, respectively through switches 464, 465, 466, 467, 475 and 476.

The flexibility herein described is partially achieved through the numerous bi-directional switches used. It was also noted previously that the switches can be implemented a variety of ways. For example, the switches can be implemented as fusible links which are programmed by blowing the fuse to open or short the switch. Alternately, the switch can be a passgate controlled by a bit in an SRAM array. The state of the bits in the array dictate whether a corresponding passgates are open or closed.

To allow an efficient implementation of a carry chain as well as other applications, staggered or barrel connections between clusters is used to increased connectivity. FIG. 4*b* illustrates the extensions of the I-Matrix within a logic cluster to neighboring clusters. For example, switch 475 connects I-M5 of cluster 460 to I-M0 of cluster 461 and switch 476 connects I-M1 of cluster 460 to I-M2 of cluster 461.

Figure 5A:
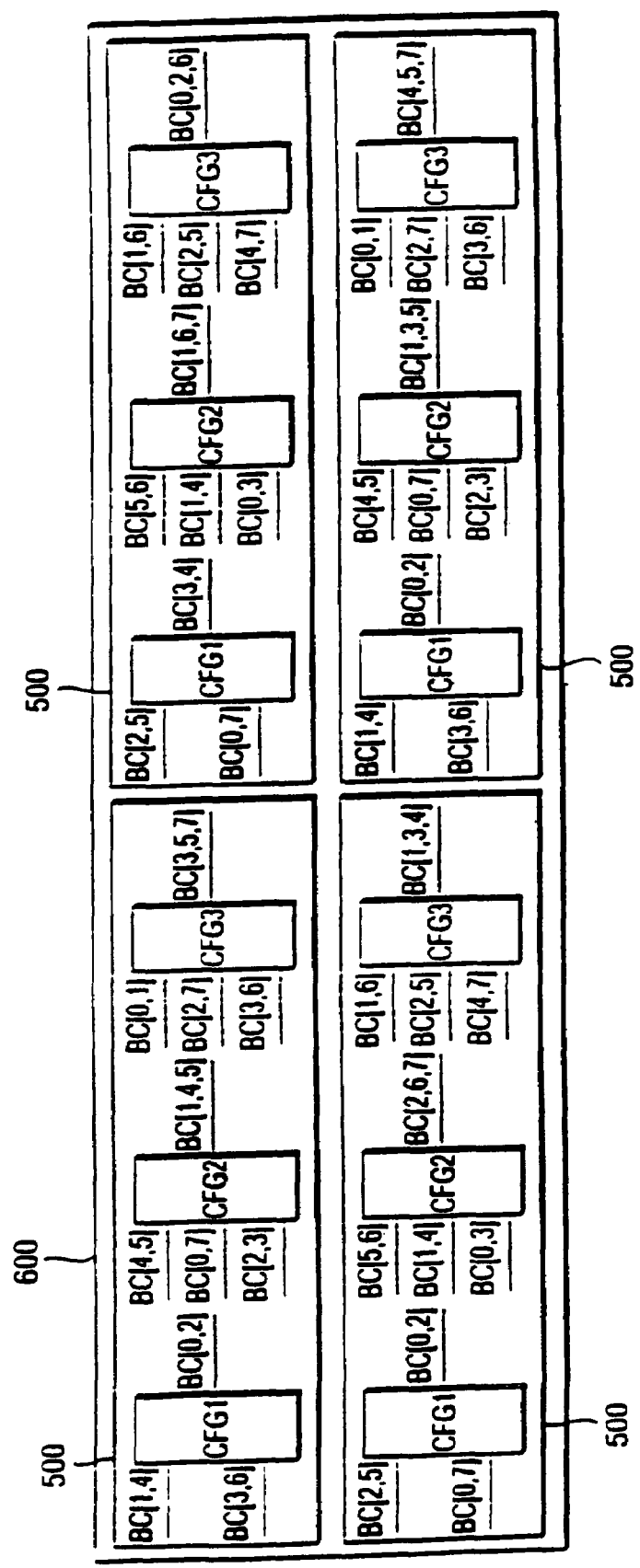
FIGS. 5A and 5B provide further illustration of the organization of the programmable logic of FIG. 3.

A plurality of interconnected logic clusters form a logic block. In the present embodiment each logic block consists of four logic clusters organized in a 2×2 array as generally illustrated by FIG. 5*a*. Each logic block has a set of bi-directional routing lines to which all CFGs inside the logic clusters are programmably connected. The bi-directional routing line provide the path for signals to travel into and out of the logic block to the routing lines of a hierarchical routing architecture having multiple lengths of interconnections at different levels of the hierarchy. It can also be seen that the block connectors can also provide connections among the CFGs of the logic clusters of the same block and adjacent blocks. Although the input and output of each element of each logic cluster of the logic block can be selectively connected to each block connector, to control the expansion on die size it is preferred that each input and output is selectively connected to a subset of block connectors. An example of such an embodiment is shown in FIG. 5*b*.

Figure 5B:
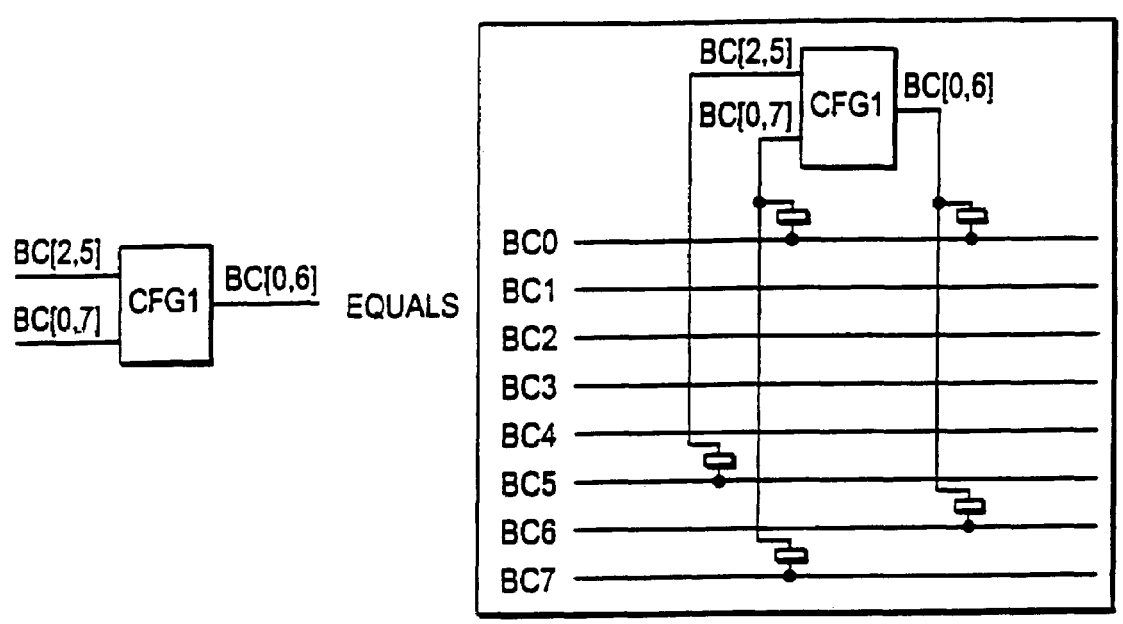

Referring to FIG. 5*b*, a symbolic representation of one embodiment of the connections to block connectors within a block 300 is shown. Each element of each cluster 500, e.g., CFG1, CFG2 and CFG3 is connected to two identified block connectors (BC) at the inputs. Two block connectors are identified as coupled to the output of the two input CFG1 and three block connectors are coupled to the output of the three input CFGs (CFG2, CFG3). The specific block connectors coupled to each elements are distributed among the elements of the block to maximize connectivity.

The block connectors provide the input and output mechanism for interconnecting to higher levels of connections of the routing hierarchy referred to as the multiple level architecture (MLA) routing network. The network consists of multiple levels of routing lines (e.g., MLA-1, MLA-2, MLA-3, MLA-4, etc.) organized in a hierarchy wherein the higher level routing lines are a multiple longer than the lower level routing lines. For example, MLA-2 routing lines are twice as long as MLA-1 routing lines and MLA-3 routing lines are twice as long as MLA-2 routing lines and MLA-4 routing lines are twice as long as MLA-3 routing lines.

Using the logic and interconnect hierarchy described, the user can program the PLD and the bus to access the memory in a variety of configurations without requiring significant space on the component.

Figure 6:
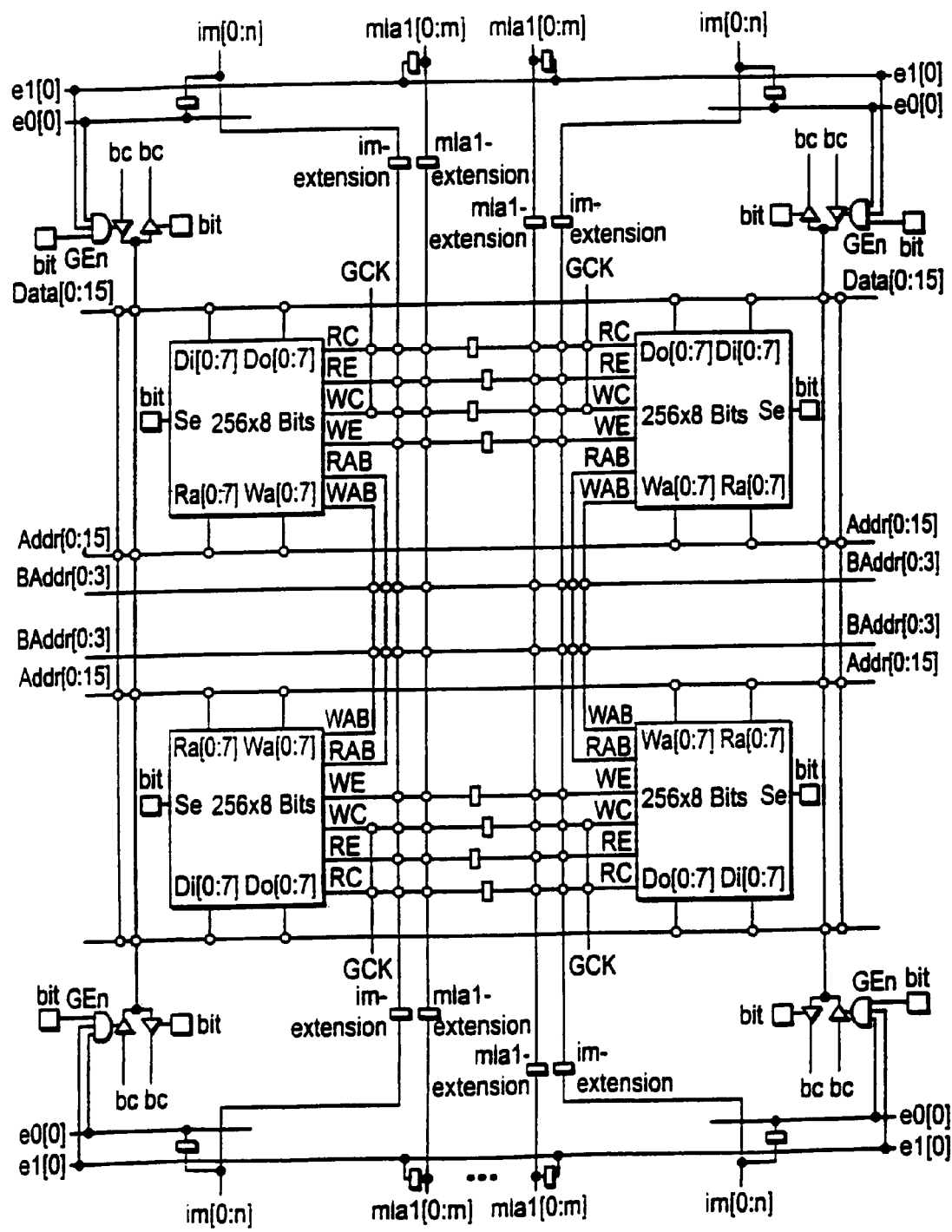
FIG. 6 illustrates the programmability of connections to bussed signal lines to multiple megacells in accordance with the teachings of the present invention.

The flexibility and utility of the configurable bus system of the present invention is illustrated with reference to FIG. 6. FIG. 6 shows the bus system configured to couple to 4 SRAM megacells arranged in a 2×2 configuration. The programmable elements are configured as passgates controlled by a bit in one of the SRAMs or other coupled memory. As is illustrated, no extra logic or interconnect is required for the bus system configuration. By enablement of the proper links which control the interconnect, the bus system is easily configured for the particular arrangement of megacells.

In the present example, the bus system is programmed to be coupled to the interconnect of the PLD (e.g., block connectors (bc), I-matrix lines (IM) and MLA lines (MLA-1)) to enable the logic of the PLD to provide the necessary interface logic to interface the SRAM to components or devices external to the system. For example, the PLD provides logic to assert the necessary control signals to transmit the address information and receive and transmit data. In the example shown in FIG. 6, data and address information is communicated through the bi-directional block connectors. Control information, including control signals to control the state of the enable signals (e0, e1) are communicated via the I-matrix and MLA-1 lines.

Figure 7A:
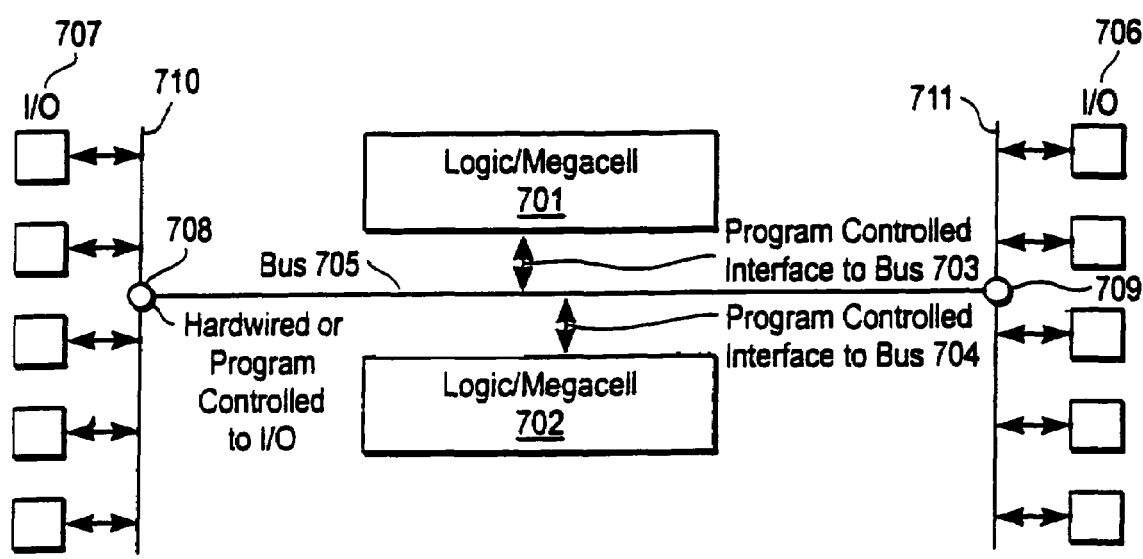
FIG. 7a is a block diagram illustration of one embodiment of a megacell connected to the bus system and I/O.

FIG. 7a is a block diagram illustration of one embodiment of megacell 701, 702, coupled to the bus system of the present invention. A program controlled interface 703, 704, to the bus system of lines 705 and megacells 701, 702 are provided. The interface from the core bus 705 to the I/O 706, 707 can be achieved using hardwired or program controlled connections 708, 709. Preferably, these connections are achieved using a programmable, peripheral bus system of lines 710, 711 to provide further flexibility. The peripheral bus system is preferably programmable in the same manner as described above with respect to FIG. 2. In the present embodiment, the interface logic (230 FIG. 2) provides the program controlled interface 703, 704 to the bus system 705 which is also programmed controlled.

Figure 7B:
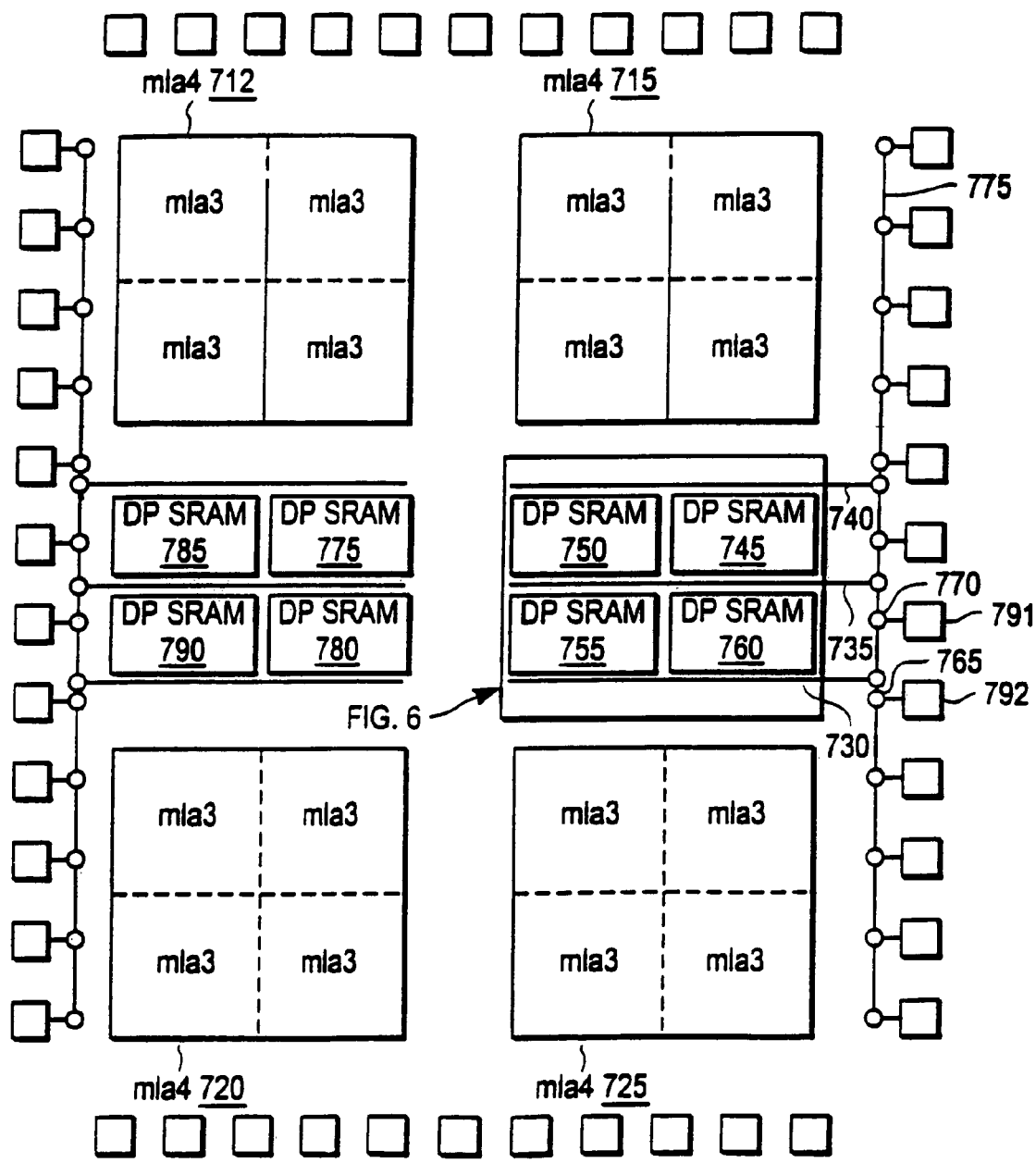
FIG. 7b illustrates one embodiment of a dual-port static random access memory (SRAM) megacell with a field programmable gate array (FPGA).

FIG. 7b depicts an overview of an exemplary component configured with dual port SRAM megacells and a FPGA. The FPGA, including its interconnect structure, is represented by elements 712, 715, 720, 725. Each element 712, 715, 720, 725 comprises a plurality of logical blocks organized in 16x≠array with a corresponding hierarchical interconnect structure as discussed in U.S. Pat. No. 5,457,410 and U.S. Pat. application Ser. No. 08/534,500. The FPGA elements 712, 715, 720, 725 are connected by the interconnect, e.g., block connectors, I-matrix lines and MLA lines (see FIG. 6), through the configurable bus system of lines (e.g., as represented by elements 730, 735, 740) to an SRAM (e.g., 745, 750, 755, 760). SRAM 745, 750, 755, 760 and elements 730, 735 and 740 correspond to the structure illustrated by FIG. 6. It should be noted that the bus system preferably spans the entire component to the adjacent array of SRAMs 775, 780, 785, 790 through programmable elements (not shown). The bus system is further coupled to I/O ports or pads (e.g., 791, 792) for input/output to/from the system to external components or devices. Although the bus system can be coupled through hardwired connections, it is preferred that the connection be made via programmable elements, e.g., 765, 770 and bus system of lines 775.

Figure 8A:
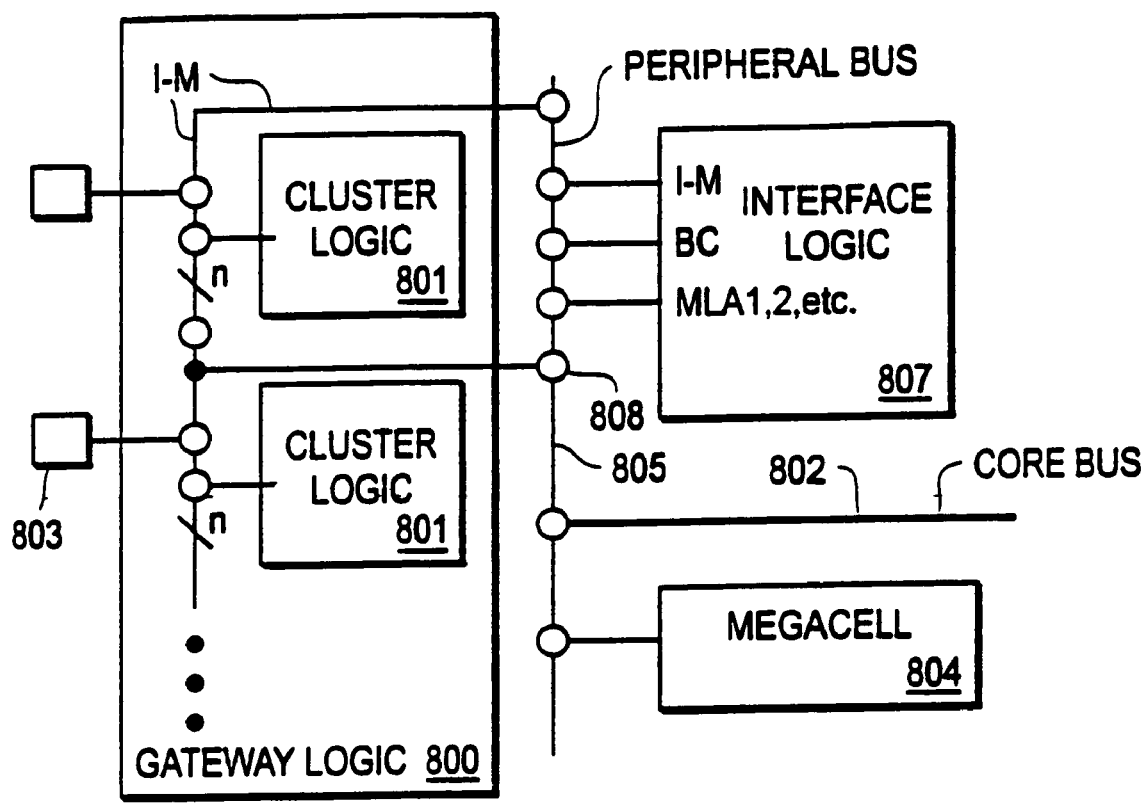
FIG. 8a is a block diagram illustration of an alternate embodiment and FIG. 8b illustrates the embodiment incorporated into a dual port SRAM with a FPGA.

FIG. 8a is a block diagram illustration of an alternate embodiment in which gateway interface logic 801 is used to interface the core bus system 802 to the I/O 803. In addition, this diagram illustrates alternative programmable connections that can be implemented to provide further programmability and flexibility to the system.

The gateway interface logic 800 is composed of hardwired logic, metal programmable logic, or programmable logic such as a plurality of logic clusters and is directly or indirectly coupled (i.e., direct hardwired connections or indirect program controlled connections) to the megacell 804. FIG. 8a shows the gateway interface logic 800 is coupled to the megacell 804 via peripheral bus 805 which preferably includes bi-directional, three-statable connections (e.g., 808). The gateway interface logic 800 provides an additional level of logic to the interface between the megacell and the I/O pads or ports to external components or devices. The gateway interface logic can enable faster transfer of information. For example, the gateway interface logic can be structured to provide the specific bus protocols or handshaking required to interface to external devices. The gateway interface logic can also provide address decode functionality (e.g., wide decode) to expedite processing of information.

In the present embodiment, the gateway interface logic 800 is implemented as a logic cluster 801, consistent with the logic clusters referred to herein and in U.S. Pat. No. 5,457,410 and U.S. patent application Ser. No. 08/534,500. I-Matrix lines are used to connect the gateway logic to the peripheral bus 805. It should be recognized that the gateway interface logic is not limited to the specific implementation described herein and a variety of logic implementations can be used.

Figure 8B:
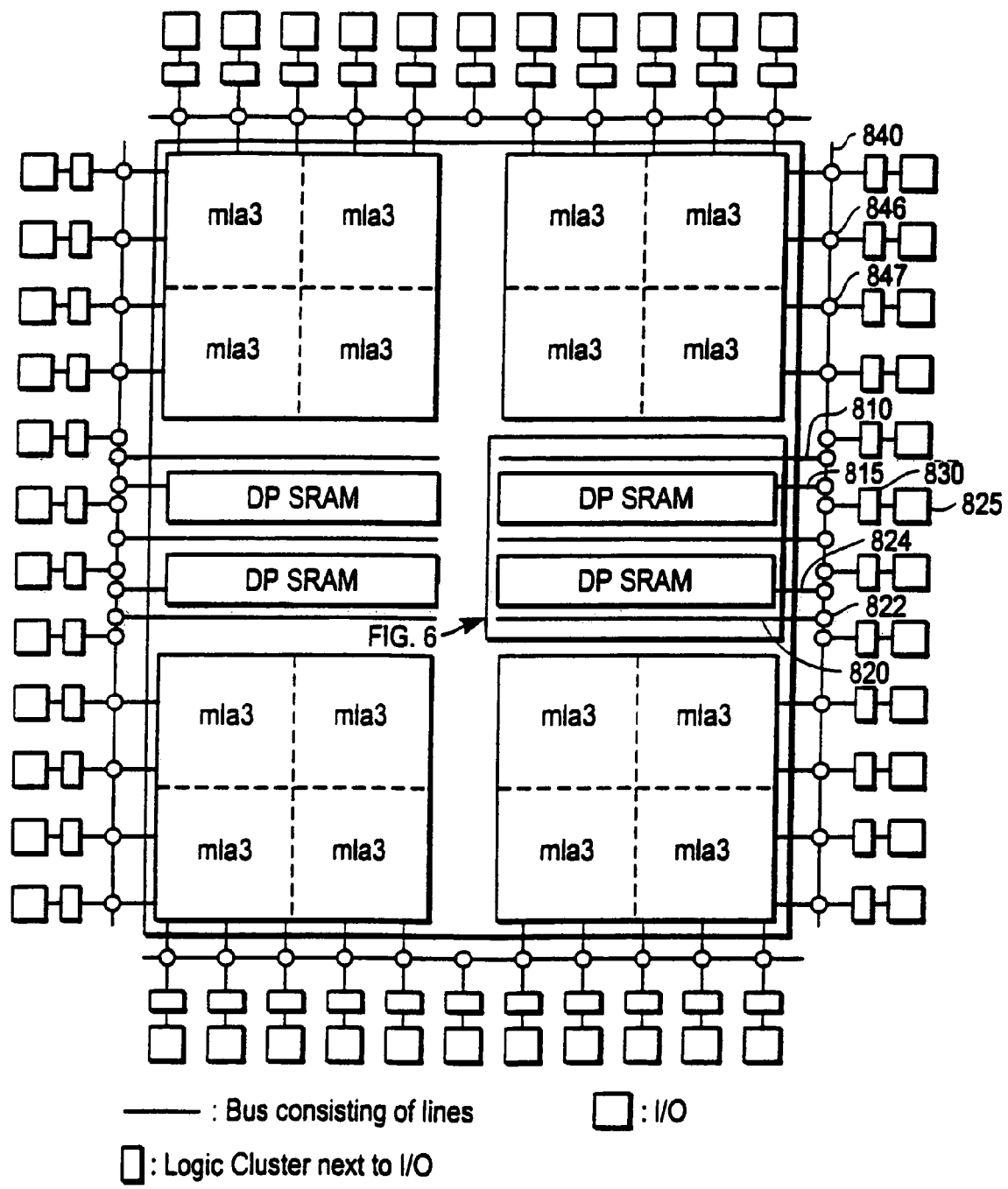

FIG. 8b illustrates dual port SRAMs with FPGA and the configurable bus system. In this embodiment, further programmability is provided at the I/O ports of the system using gateway interface logic. In particular, the programmable gateway logic (e.g, 830) is located between the core bus system of lines (e.g., elements 810, 815, 820) and the I/O (e.g., 825). In the present embodiment a logic cluster as illustrated in FIG. 4a is used; however, as noted above, it is contemplated that other forms of logic can be utilized. In addition, this embodiment includes a peripheral bus system of lines 840, which functions is a manner similar to the core bus system of lines, providing a programmable bus system for transferring information. Preferably, each of the programmable connections of the bus system (e.g., 846, 847) are bi-directional, three-statable connections.

Further enhancements and interconnect flexibility is achieved by providing programmable connections from the core bus (e.g., 820) direct to the peripheral bus 840 and from the megacell (e.g., 845) direct to the peripheral bus 840. For example, programmable connection 822 selectively enables the bus element 820 to be connected to peripheral bus 840. Similarly, programmable element 824 selectively connects megacell 845 directly to peripheral bus 840. Such flexibility is advantageous when speed is a consideration. For example, it may be desirable to directly connect externally received control input data to the megacell.

The invention has been described in conjunction with the preferred embodiment. It is evident that numerous alternatives, modifications, variations and uses will be apparent to those skilled in the art in light of the foregoing description.

What is claimed is:

1. An integrated circuit, comprising:
a programmable logic array comprising:
a plurality of logic cells, wherein the logic cells are organized in two dimensions; and
a first one or more routing resources selectively coupled to the plurality of logic cells;
a second one or more routing resources located adjacent to the programmable logic array the second one or more routing resources being different than the first one or more routing resources;
a plurality of megacells configured to receive inputs and transmit outputs;
wherein each of the plurality of megacells is selectively coupled to the second one or more routing resources; and
wherein the second one or more routing resources are selectively coupled to the programmable logic array.

2. The integrated circuit as set forth in claim 1, wherein each of the plurality of megacells is selectively coupled to the programmable logic array.

3. The integrated circuit as set forth in claim 2, wherein the second one or more routing resources are selectively coupled to at least one of the programmable logic array and each of the plurality of megacells through logic controlled three-stable outputs.

4. The integrated circuit as set forth in claim 3, wherein each of the plurality of megacells comprises a memory block.

5. The integrated circuit as set forth in claim 4, wherein two or more of the plurality of megacells are cascaded to form a single memory block being deeper than one of the plurality of megacells.

6. The integrated circuit as set forth in claim 4, wherein two or more of the plurality of megacells are cascaded to form a single memory block being wider than one of the plurality of megacells.

7. The integrated circuit as set forth in claim 4, wherein four or more of the plurality of megacells are cascaded to form a single memory block being deeper and wider than one of the plurality of megacells.

8. The integrated circuit as set forth in claim 3, wherein each of the plurality of megacells is a dual port SRAM block.

9. The integrated circuit as set forth in claim 8, wherein two or more of the plurality of megacells are cascaded to form a single dual port SRAM block being deeper than one of the plurality of megacells.

10. The integrated circuit as set forth in claim 8, wherein two or more of the plurality of megacells are cascaded to form a single dual port SRAM block being wider than one of the plurality of megacells.

11. The integrated circuit as set forth in claim 8, wherein four or more of the plurality of megacells are cascaded to form a single dual port SRAM block being deeper and wider than one of the plurality of megacells.

12. The integrated circuit as set forth in claim 11, wherein the routing resources comprise interconnection lines.

13. The integrated circuit as set forth in claim 11, wherein each of the first and second groups of routing resources are programmable through switches.

14. A method of operating an integrated circuit having a programmable logic array, comprising:
selectively coupling a first one or more routing resources to a plurality of logic cells of the programmable logic array, wherein the logic cells are organized in two dimensions, wherein a second one or more routing resources is located adjacent to the programmable logic array, the second one or more routing resources being different than the first one or more routing resources;
receiving inputs to and transmitting outputs from a plurality of megacells;
selectively coupling each of the plurality of megacells to the second one or more routing resources; and
selectively coupling the second one or more routing resources to the programmable logic array.

15. The method of claim 14, further comprising selectively coupling the plurality of megacells to the programmable logic array.

16. The method of claim 15, further comprising selectively coupling the second one or more routing resources to at least one of the programmable logic array and the megacells through logic controlled three-stable outputs.

17. The method of claim 16, wherein each of the plurality of megacells comprises a memory block.

18. The method of claim 17, further comprising cascading two or more of the plurality of megacells to form a single memory block being deeper than one of the plurality of megacells.

19. The method of claim 18, wherein cascading comprises selectively coupling data buses of the second one or more routing resources.

20. The method of claim 17, further comprising cascading two or more of the plurality of megacells to form a single memory block being wider than one of the plurality of megacells.

21. The method of claim 20, wherein cascading comprises selectively coupling address buses of the second one or more routing resources.

22. The method of claim 17, further comprising cascading four or more of the plurality of megacells to form a single memory block being deeper and wider than one of the plurality of megacells.

23. The method of claim 22, wherein cascading comprises selectively coupling data buses and address buses of the second one or more routing resources.

24. The method of claim 17, further comprising cascading two or more of the plurality of megacells to form a single dual port SRAM block being deeper than one of the plurality of megacells.

25. The method of claim 24, wherein cascading comprises selectively coupling data buses of the second one or more routing resources.

26. The method of claim 17, further comprising cascading two or more of the plurality of megacells to form a single dual port SRAM block being wider than one of the plurality of megacells.

27. The method of claim 26, wherein cascading comprises selectively coupling address buses of the second one or more routing resources.

28. The method of claim 17, further comprising cascading four or more of the plurality of megacells to form a single dual port SRAM block being deeper and wider than one of the plurality of megacells.

29. The method of claim 28, wherein cascading comprises selectively coupling data buses and address buses of the second one or more routing resources.

* * * * *